(12) United States Patent
Khenkin et al.

(10) Patent No.: US 12,704,530 B2
(45) Date of Patent: Aug. 11, 2026

(54) CURRENT-SENSING RESISTOR

(71) Applicant: Cirrus Logic International Semiconductor Ltd., Edinburgh (GB)

(72) Inventors: Aleksey Khenkin, Lago Vista, TX (US); Ravi K. Kummaraguntla, Austin, TX (US); John C. Tucker, Austin, TX (US); John L. Melanson, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 108 days.

(21) Appl. No.: 18/666,028

(22) Filed: May 16, 2024

(65) Prior Publication Data

US 2025/0076343 A1 Mar. 6, 2025

Related U.S. Application Data

(60) Provisional application No. 63/598,659, filed on Nov. 14, 2023, provisional application No. 63/580,731, filed on Sep. 6, 2023.

(51) Int. Cl.

| | |
|---|---|
| ***G01R 1/20*** | (2006.01) |
| ***G01R 15/14*** | (2006.01) |
| ***G01R 19/00*** | (2006.01) |

(52) U.S. Cl.
CPC ....... *G01R 15/146* (2013.01); *G01R 19/0092* (2013.01)

(58) Field of Classification Search
CPC ... G01R 1/203; G01R 15/146; G01R 19/0092
See application file for complete search history.

(56) References Cited

U.S. PATENT DOCUMENTS

| | | | | |
|---|---|---|---|---|
| 8,922,271 | B1 * | 12/2014 | Moothedath | G01R 31/31924 327/540 |
| 2016/0172026 | A1 * | 6/2016 | Lee | G11C 11/1655 365/148 |
| 2021/0141006 | A1 * | 5/2021 | Yokoi | H03K 17/122 |
| 2023/0184813 | A1 * | 6/2023 | Neag | H03F 3/45937 |
| 2023/0384363 | A1 * | 11/2023 | Sima | G01R 31/31705 |
| 2024/0178653 | A1 * | 5/2024 | Telefus | H02H 3/32 |

* cited by examiner

*Primary Examiner* — Thang X Le
(74) *Attorney, Agent, or Firm* — Jackson Walker L.L.P.

(57) ABSTRACT

In accordance with embodiments of the present disclosure, a system may include a main integrated circuit (IC) comprising current measurement circuitry, an auxiliary current sense resistor coupled to the main IC, and an auxiliary pair of Kelvin sense resistors coupled between the auxiliary current sense resistor and the current measurement circuitry. The main IC may further comprise current injection circuitry configured to inject a known sink current which is split between a main current in a first path and an auxiliary current in a second path comprising the auxiliary current sense resistor.

30 Claims, 4 Drawing Sheets

CURRENT-SENSING RESISTOR

RELATED APPLICATION

The present disclosure claims priority to U.S. Provisional Application Ser. No. 63/580,731 filed Sep. 6, 2023, and U.S. Provisional Application Ser. No. 63/598,659, filed Nov. 14, 2023, both of which are incorporated by reference herein in their entireties.

FIELD OF DISCLOSURE

The present disclosure relates in general to circuits for electronic devices, including without limitation audio devices, piezoelectric devices, haptic-feedback devices, wireless telephones, media players, and/or mobile devices, and more specifically, to circuits including resistors for sensing current in an electronic device.

BACKGROUND

Many electronic devices, including without limitation audio devices, piezoelectric devices, haptic-feedback devices, wireless telephones, media players, and/or mobile devices, may include circuits sensing a current in the electronic device. Current sensing may be useful for a number of reasons, including without limitation power management of an electronic device, estimation of impedances in an electronic device, and other applications. Often, current sensing circuitry includes a sense resistor of known resistance, and measurement circuitry may determine a current flowing through the sense resistor by measuring the voltage across the resistor and calculating the current required to induce such voltage across the resistor in accordance with Ohm's Law, which states that a voltage across a resistor is the mathematical product of the current across the resistor and the resistance of the resistor.

In many instances, it is required that a current sense resistor be accurate, and capable of handling a highest peak current possible for a high-power application in addition to the current sense resistor being appropriate for low-power application at a minimal cost in terms of integrated circuit die area.

SUMMARY

In accordance with the teachings of the present disclosure, one or more disadvantages and problems associated with existing approaches to measuring current in an electronic device may be reduced or eliminated.

In accordance with embodiments of the present disclosure, a system may include a main integrated circuit (IC) comprising current measurement circuitry, an auxiliary current sense resistor coupled to the main IC, and an auxiliary pair of Kelvin sense resistors coupled between the auxiliary current sense resistor and the current measurement circuitry. The main IC may further comprise current injection circuitry configured to inject a known sink current which is split between a main current in a first path and an auxiliary current in a second path comprising the auxiliary current sense resistor.

In accordance with these and other embodiments of the present disclosure, a method may be provided for a system having a main integrated circuit (IC) comprising current measurement circuitry, an auxiliary current sense resistor coupled to the main IC, and an auxiliary pair of Kelvin sense resistors coupled between the auxiliary current sense resistor and the current measurement circuitry. The method may include injecting a known sink current which is split between a main current in a first path and an auxiliary current in a second path comprising the auxiliary current sense resistor.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
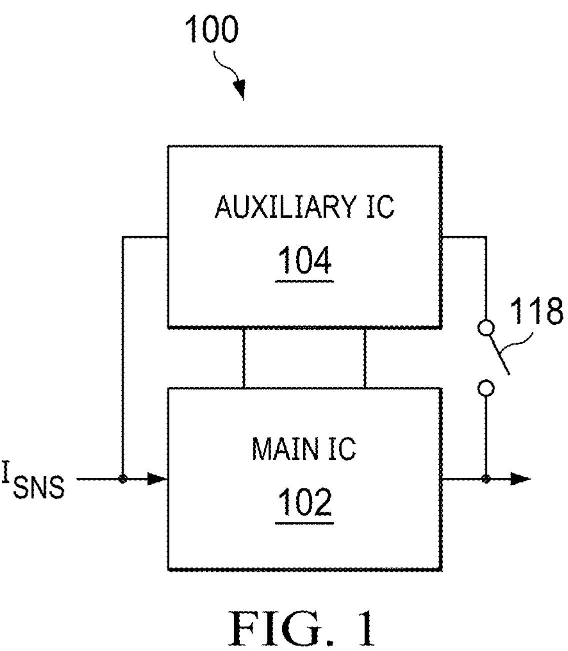
FIG. 1 illustrates an example current-sensing system, in accordance with embodiments of the present disclosure.

FIG. 1 illustrates selected components of an example current-sensing system 100, in accordance with embodiments of the present disclosure. As shown in FIG. 1, current-sensing system 100 may include a main integrated circuit (IC) 102 which may be electrically coupled to an auxiliary IC 104. As shown in FIG. 1, a coupling switch 118 may be coupled between the outputs of main IC 102 and auxiliary IC 104. In operation, as described in greater detail below, current-sensing system 100 may sense a current $I_{SNS}$ flowing through sense resistors internal to main IC 102 and auxiliary IC 104, and may be used alternatively in one of at least two or more power applications.

Figure 2:
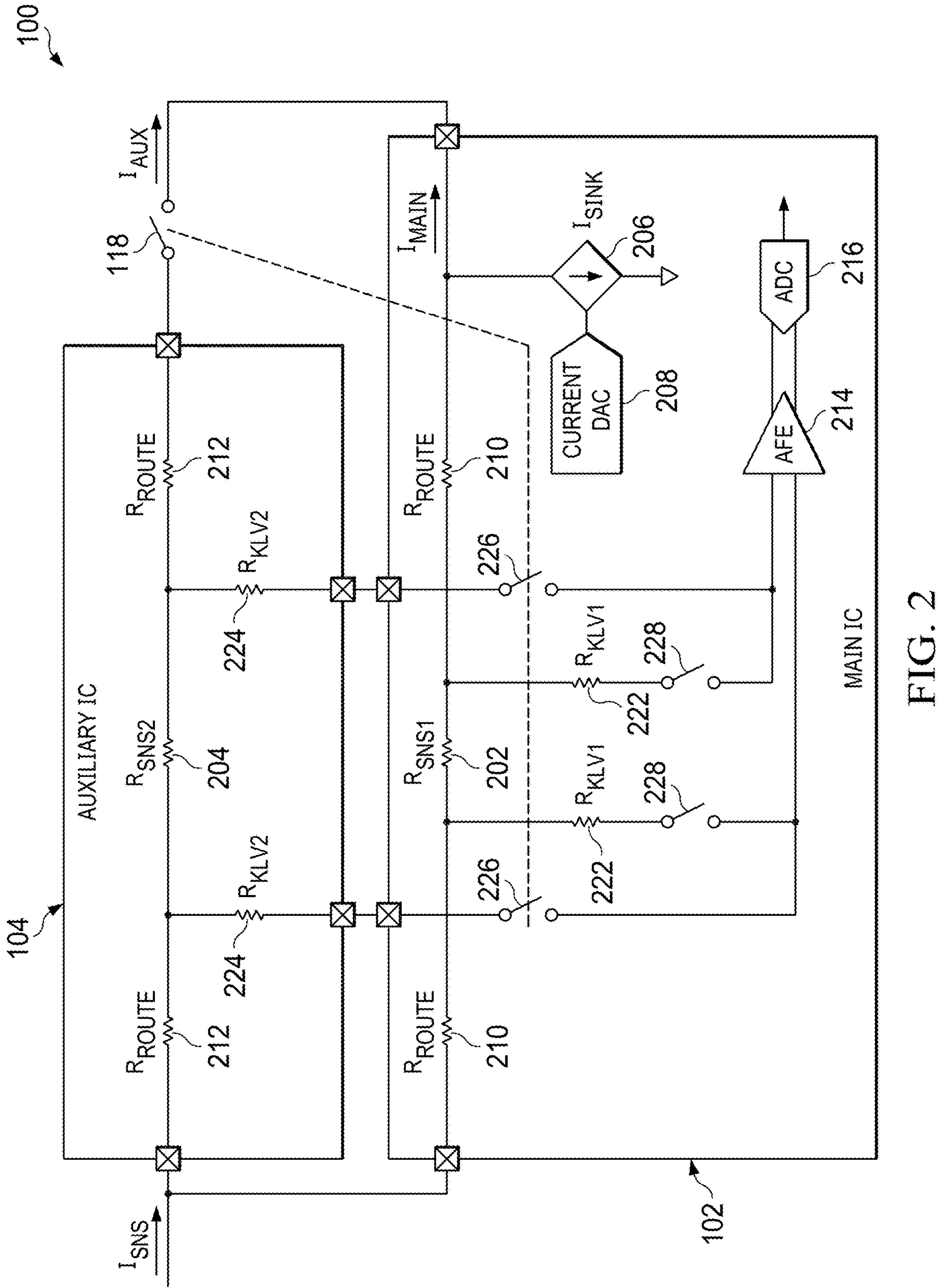
FIG. 2 illustrates the example current-sensing system of FIG. 1 with detail of example circuit topologies for integrated circuits of the example current-sensing system of FIG. 1, in accordance with embodiments of the present disclosure.

FIG. 2 illustrates the current-sensing system 100 with detail of selected components of main IC 102 and auxiliary IC 104, in accordance with embodiments of the present disclosure. As shown in FIG. 2, main IC 102 may include a main sense resistor 202 having resistance $R_{SNS1}$ and either coupled to or integral to main IC 102, and auxiliary IC 104 may include an auxiliary current sense resistor 204 having resistance $R_{SNS2}$. Auxiliary IC 104 may not include measurement circuitry, and thus auxiliary current sense resistor 204 may solely be measured by measurement circuitry of main IC 102. As described in greater detail below, main IC 102 may adjust for inaccuracies of main sense resistor 202 and auxiliary current sense resistor 204 depending on which of the at least two or more power applications is in use.

Main IC 102 may include a dependent current source 206 controlled by a current digital-to-analog converter (DAC) 208 in order to generate a known sink current $I_{SINK}$. Sink current $I_{SINK}$ may be injected into main IC 102 and respectively split between two currents: a main current $I_{MAIN}$ through a first path comprising main sense resistor 202 and an auxiliary current $I_{AUX}$ through a second path comprising auxiliary current sense resistor 204. Main current $I_{MAIN}$ and auxiliary current $I_{AUX}$ may have the same or different current values. The first path may include parasitic routing resistors 210 each having a resistance $R_{ROUTE}$ in series with main sense resistor 202, and similarly the second path may include parasitic routing resistors 212 each having a resistance $R_{ROUTE}$ in series with auxiliary current sense resistor 204.

Main current $I_{MAIN}$ may be determined based on resistance $R_{SNS1}$ of main sense resistor 202 and voltage across main sense resistor 202. Auxiliary current $I_{AUX}$ may then be determined by subtracting main current $I_{MAIN}$ from sink current $I_{SINK}$, and further, resistance $R_{SNS2}$ of auxiliary current sense resistor 204 may be determined based on auxiliary current $I_{SNS}$ and a voltage across auxiliary current sense resistor 204.

As shown in FIG. 2, auxiliary IC 104 may be coupled to dependent current source 206 via coupling switch 118. However, in some embodiments, coupling switch 118 may be optional, with coupling switch 118 of FIG. 2 replaced with a short circuit coupling auxiliary IC 104 to dependent current source 206. FIG. 2 depicts coupling switch 118 as being external to main IC 102 and auxiliary IC 104, although coupling switch 118 may be internal to either of main IC 102 and auxiliary IC 104 in some embodiments.

In FIG. 2, voltages across main sense resistor 202 and auxiliary current sense resistor 204 may be sensed via Kelvin sense resistors 222 and 224, respectively. Kelvin sense resistors 222 and 224 may have resistances $R_{KLV1}$ and $R_{KLV2}$, respectively. The voltages sensed by Kelvin sense resistors 222 and 224 may be summed at the input of a current-sense analog front end (AFE) 214 configured to receive an analog voltage and condition such analog voltage for analog-to-digital converter (ADC) 216, which may convert the analog voltage into a digital equivalent value indicative of a sensed current through one or both of main sense resistor 202 and auxiliary current sense resistor 204. The passive summing for main sense resistor 202 and auxiliary current sense resistor 204 into a single sense channel may provide the best signal-to-noise ratio for a given circuit power. Resistances $R_{KLV1}$ and $R_{KLV2}$ of Kelvin sense resistors 222 and 224 may be sized to optimize the accuracy of current-sensing system 100. For example, in some embodiments, resistances $R_{KLV1}$ and $R_{KLV2}$ of Kelvin sense resistors 222 and 224 be at least two orders of magnitude higher than their respective sense resistors 202 and 204 (e.g., $R_{KLV1} \geq 100R_{SNS1}$; $R_{KLV2} \geq 100R_{SNS2}$).

Although the foregoing contemplates summing of the voltages sensed by Kelvin sense resistors 222 and 224 at the input of a current-sense analog front end (AFE) 214 then converted to the digital domain by ADC 216, in some embodiments, such voltages may first be converted into the digital domain and then summed in the digital domain.

Each of the resistors described herein may be implemented using a physical resistor and/or a metal routing resistance.

Main IC 202 may include coupling switches 226. Control circuitry (not explicitly shown) may be configured to selectively enable and disable coupling switches 226 contemporaneously with selectively enabling and disabling coupling switch 118 in order to selectively couple and decouple auxiliary current sense resistor 204 from the input of AFE 214, depending on which of the at least two or more power applications is in use. In order to accurately match sense path impedances, main IC 202 may also include coupling switches 228 identical to coupling switches 226 between main sense resistor 204 and AFE 214. In some embodiments, coupling switches 228 may comprise dummy switches that may remain closed at all times.

In some embodiments, resistance $R_{SNS1}$ may not be equal to resistance $R_{SNS2}$. In such case, Kelvin sense resistors 222 and 224 may be scaled accordingly, such that $R_{SNS1}/R_{SNS2}=R_{KLV1}/R_{KLV2}$. Although Kelvin sense resistors 224 are shown in FIG. 2 as integral to auxiliary IC 104, in some embodiments Kelvin sense resistors 224 may be integral to main IC 102 or external to both main IC and auxiliary IC 104.

Figure 3:
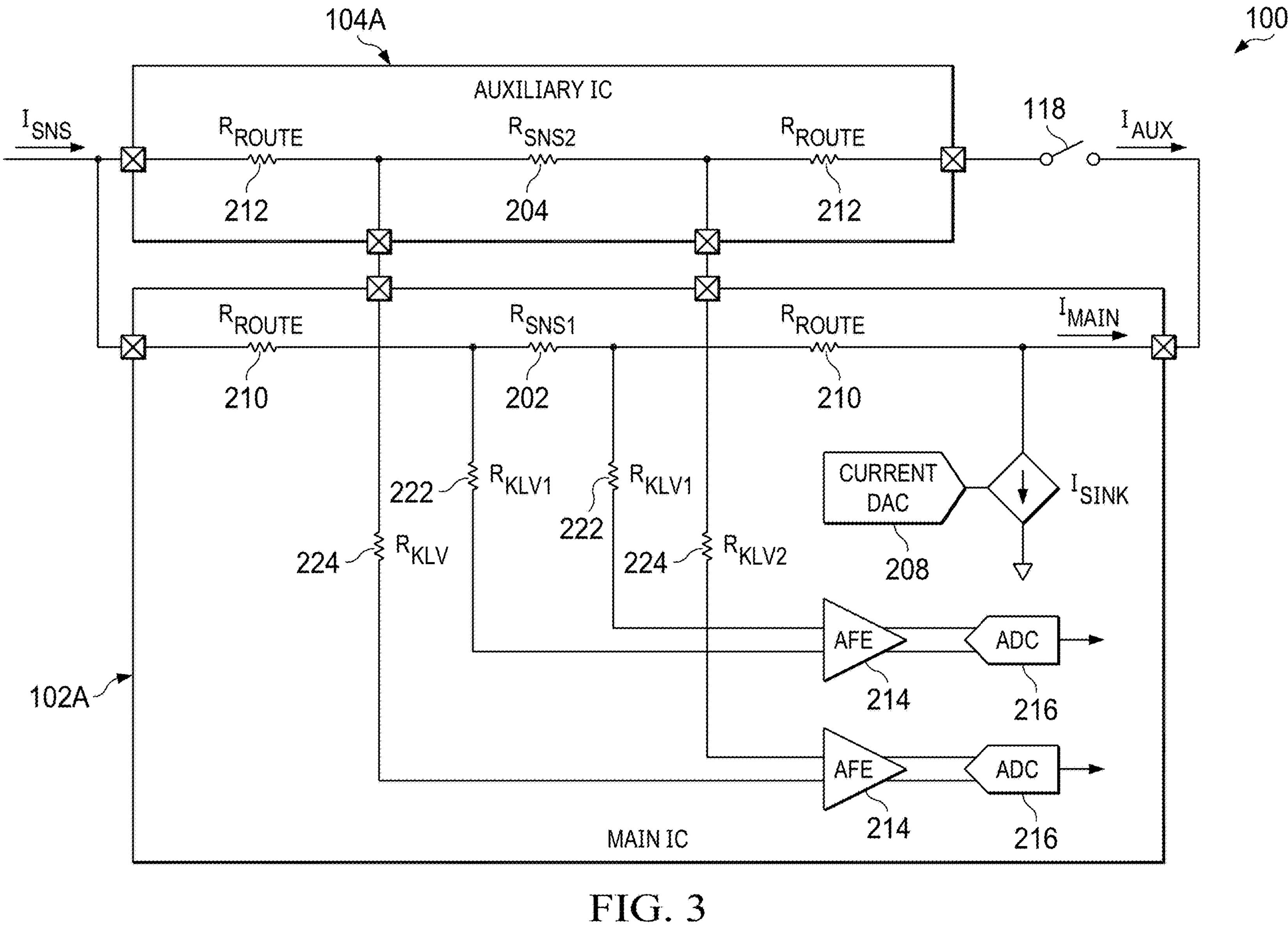
FIG. 3 illustrates an example alternative current-sensing system to that of FIG. 2, in accordance with embodiments of the present disclosure.

FIG. 3 illustrates an example current-sensing system 100A as an alternative to current-sensing system 100, in accordance with embodiments of the present disclosure. Current-sensing system 100A may be similar in many respects to current-sensing system 100, and thus only certain differences between current-sensing system 100A and current-sensing system 100 are described below.

One main difference between current-sensing system 100 and current-sensing system 100A is that while the voltages across main sense resistor 202 and auxiliary current sense resistor 204 are the same in current-sensing system 100 (i.e., main sense resistor 202 and auxiliary current sense resistor 204 are in parallel), in current-sensing system 100A, main sense resistor 202 and auxiliary current sense resistor 204 are not in parallel and thus their respective voltages may differ. Accordingly, the separate voltages across main sense resistor 202 and auxiliary current sense resistor 204 may each be sensed by their own respective sensing circuits comprising their own respective AFE 214 and ADC 216. Further, due to the separate sensing paths, current-sensing system 100A may not require coupling switches 226 and coupling switches 228.

Figure 4:
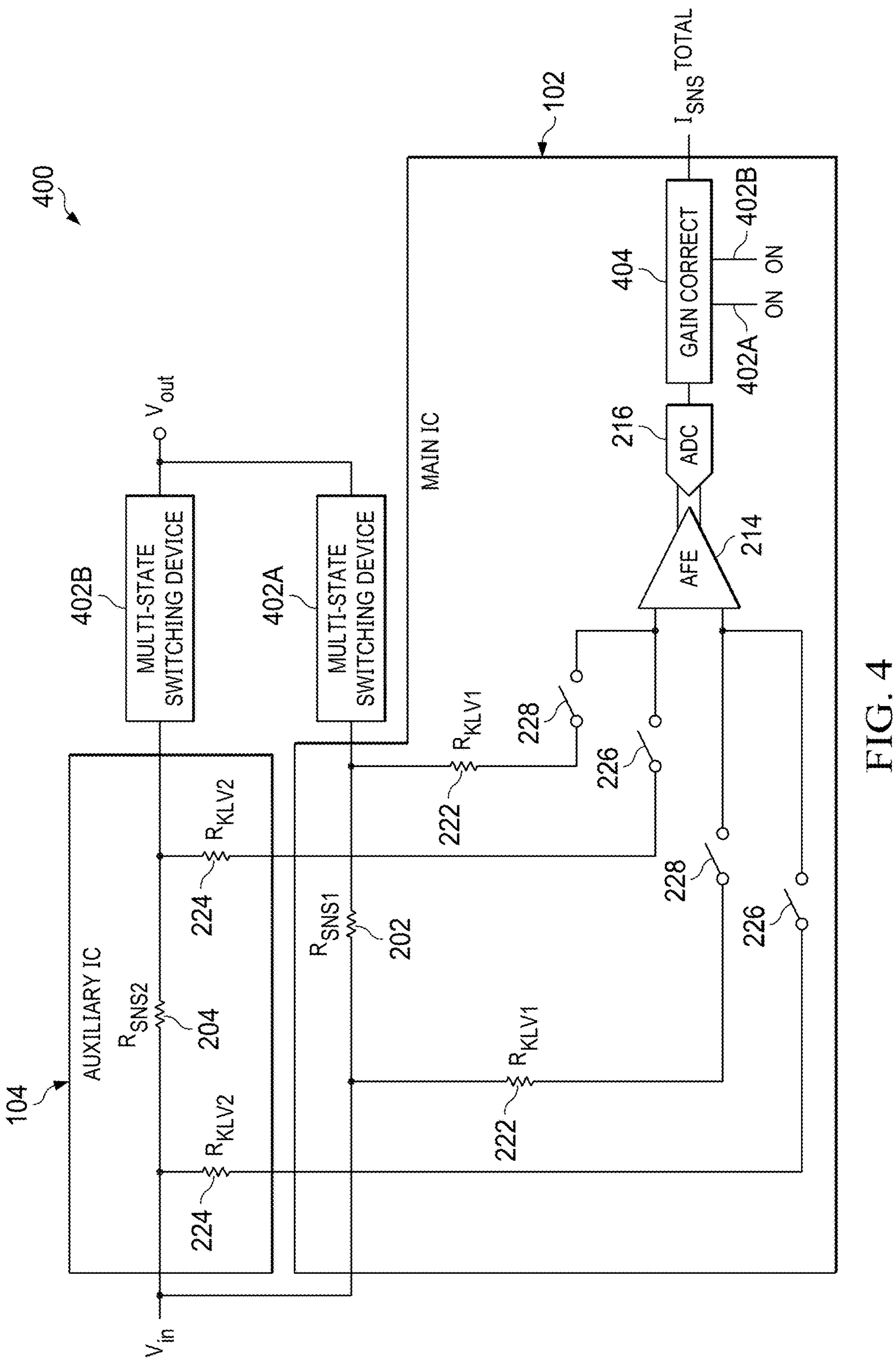
FIG. 4 illustrates selected components of an example system comprising a current-sensing system such as that depicted in FIGS. 1-3, in accordance with embodiments of the present disclosure.

FIG. 4 illustrates selected components of an example system 400 comprising a current-sensing system, such current-sensing system 100/100A depicted in FIGS. 1-3, in accordance with embodiments of the present disclosure. In particular, system 400 may include main IC 102 and auxiliary IC 104, with a multi-state switching device 402A in the path of main sense resistor 202 and a multi-state switching device 402B in the path of auxiliary current sense resistor 204. In some embodiments, each of multi-state switching device 402A and multi-state switching device 402B may comprise a battery-impedance compensating circuit (BPIC). Such BPICs may include direct current-to-direct current (DC-DC) power converters (e.g., boost, buck, or buck-boost), and may be capable of being tri-stated to an open mode (e.g., such as power converter off), a closed or bypass mode (e.g., in which bypass switches may bypass one or both of multi-state switching device 402A and multi-state switching device 402B), and a converter mode in which such multi-state switching device 402A and multi-state switching device 402B are enabled to operate as a DC-to-DC converter.

In operation in some embodiments, multi-state switching device 402A may always be active, either in the closed/bypass mode or the converter mode (and its corresponding coupling switches 228 closed) while multi-state switching device 402B may only be active (and its corresponding coupling switches 226 closed) when a certain level of power load or current is reached. AFE 214 and ADC 216 may convert a sensed voltage at the inputs of AFE 214 to a digital equivalent, and main IC 102 may include a gain correction block 404 configured to adjust a gain applied to the output of ADC 216 based on which sense resistors 202 and 204 are coupled to the inputs of AFE 214.

One or both of multi-state switching devices 402A and 402B may vary its states among the open, closed/bypass, and converter states in response to power load and/or power supply condition information. For example, the table set forth below may define the state of multi-state switching devices 402A and 402B for conditions of low-power demand (LP), high-power demand (HP), low battery charge (LBat), and high battery charge (HBat):

| | LP, LBat | LP, HBat | HP, LBat | HP, HBat |
|---|---|---|---|---|
| Multi-state switching device 402A | Converter | Closed | Converter | Closed |
| Multi-state switching device 402B | Open | Open | Converter | Closed |

In accordance with the foregoing, a method for sensing current may include coupling a plurality of current-sense resistors, each comprising voltage sense points configured to provide accurate voltage sensing, in series with a multi-state switching device. The method may further include coupling the pairs of in-series connected resistors and switching devices as branches of a parallel circuit and controlling said switching device states in response to specified conditions. The method may also include coupling said voltage sensing connections to a current-sense IC via switches, coupling said current-sense IC to an internal or external adjustable gain circuit, and measuring voltage across one or more current-sense resistors and calculating the current flowing therethrough utilizing the information about the states of the switching devices. The multi-state switching devices may operate as a DC-DC converter (e.g., buck, boost, or buck-boost), an open switch, or a closed/bypass switch in response to the power load and/or power supply condition information. The gain circuit may adjust a gain in response to states of the switching devices. The voltage-sensing switches may be open when the corresponding switching device state is set to "open" and may be closed for all other states. The power load and power supply condition information may be provided by external subsystems/systems. The power load information may be derived from current measurements by the current sense IC. The power supply condition information may be provided by either current sense IC and/or the switching devices.

In some embodiments, current-sensing system 100/100A may perform calibration. For example, variations in tolerances of sense resistors may be calibrated individually or together as a single resistor comprising parallel elements. Calibration may be performed at test by the manufacturer, or in-situ using, for example, an on-chip current source. Any such in-situ calibration may be performed during specific times when, for example, a host device current demand is minimal. As another example, to calibrate for temperature, a separate external sensing element, such as a resistor with a known temperature coefficient, may be used.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112 (f) unless the words "means for" or "step for" are explicitly used in the particular claim.

What is claimed is:

1. A system comprising:

a main integrated circuit (IC) comprising current measurement circuitry;

an auxiliary current sense resistor coupled to the main IC; and an auxiliary pair of Kelvin sense resistors coupled between the auxiliary current sense resistor and the current measurement circuitry;

wherein the main IC further comprises current injection circuitry configured to inject a known sink current which is split between a main current in a first path and an auxiliary current in a second path comprising the auxiliary current sense resistor.

2. The system of claim 1, further comprising:

a main current sense resistor coupled to or integral to the main IC, wherein the main current sense resistor is in the first path; and a main pair of Kelvin sense resistors coupled between the main current sense resistor and the current measurement circuitry.

3. The system of claim 2, wherein each resistor of the main pair of Kelvin sense resistors has a resistance at least 100 times greater than the main current sense resistor.

4. The system of claim 2, further comprising:

a first pair of switches coupled in series with the main pair of Kelvin sense resistors; and a second pair of switches coupled in series with the auxiliary pair of Kelvin sense resistors.

5. The system of claim 4, wherein the first pair of switches is configured to be enabled at all times during operation of the system.

6. The system of claim 2, further comprising:

a first multi-state switching device coupled in series with the main current sense resistor;

a second multi-state switching device coupled in series with the auxiliary current sense resistor, wherein a first state of the first multi-state switching device and a second state of the second multi-state switching device are based on conditions of the system;

the current measurement circuit; and a gain correction block configured to adjust a gain applied to an output of the current measurement circuitry based on which of the main current sense resistor and the auxiliary current sense resistor are coupled to inputs of the current measurement circuitry.

7. The system of claim 6, wherein the conditions of the system comprise one or more of a power load of the system and a condition of a power supply of the system.

8. The system of claim 6, wherein states of the first state and the second state comprise one of: an open state in which the respective multi-state switching device is inactive, a closed state in which the respective multi-state switching device is active and operates to bypass an input of the respective multi-state switching device to an output of the multi-state switching device, and a converter state in which the multi-state switching device operates as a direct current-to-direct current power converter.

9. The system of claim 6, wherein each of the first multi-state switching device and the second multi-state switching device comprise respective battery impedance compensating circuits.

10. The system of claim 2, wherein:

the main current is determined based on a resistance of the main sense resistor and a voltage across the main sense resistor; and the auxiliary current is determined based on a resistance of the auxiliary current sense resistor and a voltage across the auxiliary current sense resistor.

11. The system of claim 2, wherein the main current sense resistor and the auxiliary current sense resistor are in parallel.

12. The system of claim 2, wherein the main current sense resistor and the auxiliary current sense resistor are not in parallel.

13. The system of claim 1, wherein each resistor of the auxiliary pair of Kelvin sense resistors has a resistance at least 100 times greater than the auxiliary current sense resistor.

14. The system of claim 1, wherein the auxiliary pair of Kelvin sense resistors are integral to the main IC.

15. The system of claim 1, wherein the auxiliary current sense resistor is integral to an auxiliary IC coupled to the main IC.

16. A method, in a system having a main integrated circuit (IC) comprising current measurement circuitry, an auxiliary current sense resistor coupled to the main IC, and an auxiliary pair of Kelvin sense resistors coupled between the auxiliary current sense resistor and the current measurement circuitry, the method comprising:

injecting a known sink current which is split between a main current in a first path and an auxiliary current in a second path comprising the auxiliary current sense resistor.

17. The method of claim 16, wherein the system further comprises:

a main current sense resistor coupled to or integral to the main IC, wherein the main current sense resistor is in the first path; and a main pair of Kelvin sense resistors coupled between the main current sense resistor and the current measurement circuitry.

18. The method of claim 17, wherein each resistor of the main pair of Kelvin sense resistors has a resistance at least 100 times greater than the main current sense resistor.

19. The method of claim 17, wherein the system further comprises:

a first pair of switches coupled in series with the main pair of Kelvin sense resistors; and a second pair of switches coupled in series with the auxiliary pair of Kelvin sense resistors.

20. The method of claim 19, further comprising enabling the first pair of switches at all times during operation of the system.

21. The method of claim 17, wherein:

the system further includes:

a first multi-state switching device coupled in series with the main current sense resistor;

a second multi-state switching device coupled in series with the auxiliary current sense resistor, wherein a first state of the first multi-state switching device and a second state of the second multi-state switching device are based on conditions of the system;

the current measurement circuitry; and the method further includes adjusting, with a gain correction block of the system, a gain applied to an output of the current measurement circuitry based on which of the main current sense resistor and the auxiliary current sense resistor are coupled to inputs of the current measurement circuitry.

22. The method of claim 21, wherein the conditions of the system comprise one or more of a power load of the system and a condition of a power supply of the system.

23. The method of claim 21, wherein states of the first state and the second state comprise one of: an open state in which the respective multi-state switching device is inactive, a closed state in which the respective multi-state switching device is active and operates to bypass an input of the respective multi-state switching device to an output of the multi-state switching device, and a converter state in which the multi-state switching device operates as a direct current-to-direct current power converter.

24. The method of claim 21, wherein each of the first multi-state switching device and the second multi-state switching device comprise respective battery impedance compensating circuits.

25. The method of claim 17, further comprising:

determining the main current based on a resistance of the main current sense resistor and a voltage across the main sense resistor; and determining the auxiliary current based on a resistance of the auxiliary current sense resistor and a voltage across the auxiliary current sense resistor.

26. The method of claim 17, wherein the main current sense resistor and the auxiliary current sense resistor are in parallel.

27. The method of claim 17, wherein the main current sense resistor and the auxiliary current sense resistor are not in parallel.

28. The method of claim 16, wherein each resistor of the auxiliary pair of Kelvin sense resistors have a resistance at least 100 times greater than the auxiliary current sense resistor.

29. The method of claim 16, wherein the auxiliary pair of Kelvin sense resistors are integral to the main IC.

30. The method of claim 16, wherein the auxiliary current sense resistor is integral to an auxiliary IC coupled to the main IC.

* * * * *